United States Patent
Huang et al.

(10) Patent No.: US 9,143,138 B2
(45) Date of Patent: Sep. 22, 2015

(54) PHASE LOCKED LOOP FREQUENCY SYNTHESIZER WITH REDUCED JITTER

(71) Applicant: Microsemi Semiconductor ULC, Kanata (CA)

(72) Inventors: Jun Steed Huang, Kanata (CA); Guohui Kobe Situ, Stittsville (CA)

(73) Assignee: Microsemi Semiconductor ULC (CA)

( * ) Notice: Subject to any disclaimer, the term of this patent is extended or adjusted under 35 U.S.C. 154(b) by 19 days.

(21) Appl. No.: 13/778,275

(22) Filed: Feb. 27, 2013

(65) Prior Publication Data

US 2014/0241467 A1    Aug. 28, 2014

(51) Int. Cl.
| H03L 7/06 | (2006.01) |
| H03L 7/00 | (2006.01) |
| H03L 7/081 | (2006.01) |
| H03L 7/085 | (2006.01) |
| H03L 7/087 | (2006.01) |
| H03L 7/093 | (2006.01) |
| H03L 7/18 | (2006.01) |

(52) U.S. Cl.
CPC ............ *H03L 7/00* (2013.01); *H03L 7/081* (2013.01); *H03L 7/085* (2013.01); *H03L 7/087* (2013.01); *H03L 7/093* (2013.01); *H03L 7/18* (2013.01)

(58) Field of Classification Search
USPC .................. 327/141, 144–163; 375/373–376; 331/1/A, 15–17
See application file for complete search history.

(56) References Cited

U.S. PATENT DOCUMENTS

| 4,888,564 | A | * | 12/1989 | Ishigaki | 331/1 A |
| 5,521,948 | A | * | 5/1996 | Takeuchi | 375/376 |
| 5,550,515 | A | * | 8/1996 | Liang et al. | 331/11 |
| 6,259,677 | B1 | | 7/2001 | Jain | |
| 6,630,868 | B2 | | 10/2003 | Perrott et al. | |
| 6,853,222 | B2 | * | 2/2005 | Sumi | 327/156 |
| 6,873,669 | B2 | * | 3/2005 | Nakamura | 375/375 |
| 7,288,998 | B2 | | 10/2007 | Thomsen et al. | |
| 8,085,097 | B2 | | 12/2011 | Cloutier et al. | |
| 2010/0259307 | A1 | * | 10/2010 | Kondou | 327/157 |

OTHER PUBLICATIONS

Meninger, Scott E., et al, "A Fractional-N Frequency synthesizer Architecture Utilizing a Mismatch Compensated PFD/DAC Structure for Reduced Quantization-Induced Phase Noise," IEEE Transactions on Circuits and Systems—II: Analog and Digital Signal Processing, Nov. 2003, pp. 839-849, vol. 50, No. 11, IEEE.

Shu, Keliu, et al, "A 2.4-GHz Monolithic Fractional-N Frequency Synthesizer with Robust Phase-Switching Prescaler and Loop Capacitate Multiplier," IEE Journal of Solid-State Circuits, Jun. 2003, pp. 866-874, vol. 38, No. 6, IEEE.

(Continued)

*Primary Examiner* — Brandon S Cole
(74) *Attorney, Agent, or Firm* — Laubscher, Spendlove & Laubscher, P.C.

(57) ABSTRACT

A phase locked loop frequency synthesizer has a controlled oscillator for generating an output signal at a desired frequency, a phase/frequency detector module for comparing a feedback signal derived from the controlled oscillator with a reference signal to generate an error signal, a loop filter for processing said at least one error signal from said phase/frequency detector module to generate a combined control signal for the controlled oscillator. The gain of the phase/frequency detector module can be adjusted, preferably by varying the pulse width and pulse cycle, to maintain the overall gain of the phase locked loop within a given range and thereby maximize signal to noise ratio.

17 Claims, 9 Drawing Sheets

(56) References Cited

OTHER PUBLICATIONS

Tsutsumi, Koji, et al, "A Low Noise Multi-PFD PLL with Timing Shift Circuit," Microwave Symposium Digest (MTT), 2012 IEEE MTT-S International, Jun. 17-22, 2012, pp. 1-3, IEEE, Montreal, Canada.

Swaminathan, Ashok, et al, "A Wide-Bandwidth 2.4 GHz ISM Band Fractional-N PLL with Adaptive Phase Noise Cancellation," IEEE Journal of Solid-State Circuits, Dec. 2007, pp. 2639-2650, vol. 42, No. 12, IEEE.

Bae, Jun-Han, et al, "A Low-Power Dual-PFD Phase-Rotating PLL with a PFD Controller for a 5Gb/s Serial Links," Circuits and Systems (ISCAS), IEEE International Symposium, May 20-23, 2012, pp. 2159-2162, IEEE, Seoul, Korea.

Raghavendra, R.G., et al, "Area Efficient Loop Filter Design for Charge Pump Phase Locked Loop," ACM Great Lakes Symposium on VLSI, Mar. 2007, pp. 148-151.

* cited by examiner

PHASE LOCKED LOOP FREQUENCY SYNTHESIZER WITH REDUCED JITTER

FIELD OF THE INVENTION

This invention relates to the field of frequency synthesis, and more particularly to a phase locked loop frequency synthesizer for generating an output signal at a desired frequency with reduced jitter.

BACKGROUND OF THE INVENTION

There is an increasing need for highly accurate stable clock sources to drive modern digital electronics equipment, especially in the telecommunications sector. For example, the new LTE-A standard in mobile telecommunications requires clock sources operating at a frequency in the order of 100 MHz with a jitter of 100 femtoseconds or less. The jitter represents the high-speed fluctuations from the desired center frequency. The SONET standards OC-3, OC-12 require clock frequencies of 155.52 MHz (OC-3), 622.08 MHz (OC-12) respectively with RMS jitter of in the tens of picoseconds range.

The common way of generating the desired frequency is to derive it from a lower frequency stable source, such as a very stable crystal oscillator, using a phase locked loop (PLL) with a frequency divider in the feedback path. The frequency divider can be integer-based, in which case the output frequency is an integer multiple of the clock frequency, or fractional. A fractional divider generally includes a sigma-delta modulator to modulate the divisor.

One problem with this approach is that the various components within the phase-locked loop introduce noise that manifests itself as jitter or rapid fluctuations in the output signal. Various attempts have been made to solve this problem.

One approach is described in the paper "A Fractional-N Frequency Synthesizer Architecture Utilizing a Mismatch Compensated PFD/DAC Structure for Reduced Quantization-Induced Phase Noise", IEEE Trans. On Circuit & Systems, November 2003 (SiLabs). This paper describes a technique employing a digital signal processor (DSP) in the loop filter to increase the loop gain and to minimize the jitter and die size. This technique works reasonably well when chip size is not too small. However, at small die sizes, it eventually suffers from interference between analogue and digital circuits on the die.

A multi-die solution is an option, but this solution requires extra inter-die communication lines, which not only increase the manufacturing cost, but also add additional noise. The DSP approach may also introduce extra quantization noise from the Analogue-to-Digital Converter (ADC) and interference from the DSP processor. A high-speed sampling circuit is required to reduce the quantization noise, which in turn increases the manufacturing cost.

Another approach is described in U.S. Pat. No. 8,085,097 (Hittite). This patent employs a high-order steep analog filter to reduce noise, which increases cost. The high order or steep analogue loop further has a stability issue that is sensitive to the individual analogue parameters and makes the precise control over manufacture difficult.

Yet another solution is described in the paper: "A 2.4 GHz Monolithic Fractional-N Frequency Synthesizer With Robust Phase-Switching Prescaler and Loop Capacitance Multiplier", IEEE Journ. of Solid-State Circuits, June 2003 (Texas Instruments). In this approach, the overall gain is increased through the use of dual loops, which implies double the cost.

The paper entitled "A Low Noise Multi-PFD PLL with Timing Shift Circuit", IEEE MTT-S International, 2012, describes a PLL with a series of phase/frequency detectors (PFDs) and loop filters arranged in parallel, each PFD-loop filter combination providing a separate input to the voltage controlled oscillator (VCO) of the phase locked loop. The phase comparison of each PFD is time-shifted is to avoid noise correlation. However, this approach is limited by the correlation length, which limits noise removal to a specific reference band. Also, mismatch between each parallel PFD gives rise to implementation difficulties.

SUMMARY OF THE INVENTION

While most previous attempts to reduce jitter have focused on improving the voltage-controlled oscillator (VCO), loop filter (LF), charge pump (CP), or various dividers, they have not paid sufficient attention to the phase/frequency detector (PFD). The role of the PFD is to compare the feedback signal with the reference signal in order to generate an error signal that is used to generate a control signal for the VCO. The PFD is a low cost half-digital, half-analogue component that occupies little die space and generates little noise. The main source of noise in a PFD results from its nonlinearity about the origin, which creates noise harmonics.

Embodiments of the invention amplify and isolate the phase/frequency detector (PFD) signal in the phase locked loop at the beginning of the signal chain to render it immune to noise further down the signal chain by employing more than one PFD to form a variety of compound structures to either amplify the clean phase-tracking error signal of specific frequency-offset band before it is contaminated by noise from surrounding circuits on the loop resister or to cancel out potential common-mode noise from subsequent coupling.

Embodiments of the invention also comprise a high gain phase detector bank to trade off the resister thermal noise and the related coupling noise. In one embodiment, PFDs working at different reference rates may be employed to bring down reference noise.

Thus, according to one aspect of the present invention there is provided a phase locked loop frequency synthesizer comprising a controlled oscillator for generating an output signal at a desired frequency; a phase/frequency detector module configured to compare a feedback signal derived from the controlled oscillator with a reference signal to generate at least one error signal, the phase/frequency detector module comprising a plurality of phase/frequency detectors configured to provide a variable gain; a loop filter for processing said at least one error signal from said phase/frequency detector module to generate a control signal for the controlled oscillator, and a selection module for adjusting the gain of said phase/frequency detector module in accordance with a predetermined criterion.

In one embodiment, the phase/frequency detector module is made up of series of a series of pulse width doubler (PWD) stages, each PWD stage being made up of a pair of PFDs. In each PWD stage, the first phase/frequency detector (PFD) produces a signal having a pulse width representing the delay between the feedback signal and the reference signal. The feedback signal is then delayed by the amount of this delay and applied to the second PFD, which produces an error signal having twice the pulse width of the output of the first PFD. The gain of the PFD module depends on width of the error signal pulse, and consequently each PWD effectively doubles the gain. This arrangement can provide an additional gain of about 10 dB.

It will be appreciated that in general terms the role of the PWDs is to vary the gain by varying the pulse width of the error signal for a given error. The invention is not restricted to the use of pulse width doublers. Other multiples could be employed, or the pulse width could be varied continuously.

The use of additional PFDs in a serial setting increases the signal level at the output of the PFD module, while avoiding the mismatch problems that appear in parallel designs of the prior art. Since a PFD produces a relatively clean signal, the signal-to-noise ratio in relation to the noise generated in other downstream components, such as the thermal noise coming from resistive elements, in the loop filter is improved.

The invention is applicable to a charge-pump type phase detector wherein up/dn signals direct the charging of a capacitor. However, it is also applicable to other types of phase detector.

Both fractional with Internal filter (FrcInt) and integer with external filter (IntExt) PLL structures are suitable for further jitter reduction from the current 400 fs benchmark using the techniques in accordance with the invention.

Coupling and resistor noise however remain obstacles towards achieving a 100 fs design goal. When the jitter is required to be less than 100 fs, if the phase detector works on a 10 ns (100 Mhz) cycle, there are almost 5 orders of magnitude difference, which is equivalent to maximum +50 dB to −50 dB open loop gain within the linear phase noise model. Fractional architecture relies on a dual path charge pump and internal filter to increase the gain to +40 dB inside the loop bandwidth. Integer architecture for the firmware controlled external loop filter brings the noise down to −40 dB outside the loop bandwidth. In real life, due to practical parasitical problems, neither filter is capable of achieving the ideal design goal.

According to another aspect of the invention there is provided a phase locked loop frequency synthesizer comprising a controlled oscillator for generating an output signal at a desired frequency; a first phase/frequency detector for comparing a feedback signal derived from the controlled oscillator with a reference signal to generate a first error signal, the first phase/frequency detector being proximate a source of said reference signal; a second phase/frequency detector for comparing the feedback signal derived from the controlled oscillator with the reference signal to generate a second error signal, the first phase/frequency detector being proximate said controlled oscillator; a combiner for combining the first and second error signals; and a loop filter for processing the combined first and second error signals to generate a control signal for the controlled oscillator.

In another embodiment, to minimize the nonlinear noise from PFD itself, a split main symmetric PFD architecture is employed to balance out nonlinearity. To cope with coupling noise at the same frequency across multiple channels, dual PFD structures are used to cancel the common mode interferences at an adjacent substrate. To deal with the widespread frequency-offset quantization-noise from delta-sigma modulated-shaper of either integer or fractional architecture, a number of PFDs may be ganged at different reference rates for different frequency-offset bands such that the low-pass filter and high-pass filter components are separately controlled by additional loop parameters, thus making an equivalent high order filter.

According to another aspect of the invention there is provided a phase locked loop frequency synthesizer comprising a controlled oscillator for generating an output signal at a desired frequency; a phase/frequency detector module configured to compare a feedback signal derived from the controlled oscillator with a reference signal to generate at least one error signal; a loop filter for processing the at least one error signal from the phase/frequency detector module to generate a control signal for the controlled oscillator, and wherein the phase/frequency detector module comprises a plurality of phase/frequency detectors, each configured to operate at a different rate.

BRIEF DESCRIPTION OF THE DRAWINGS

The invention will now be described in more detail, by way of example only, with reference to the accompanying drawings, in which.

DETAILED DESCRIPTION OF EMBODIMENTS OF THE INVENTION

Figure 1:
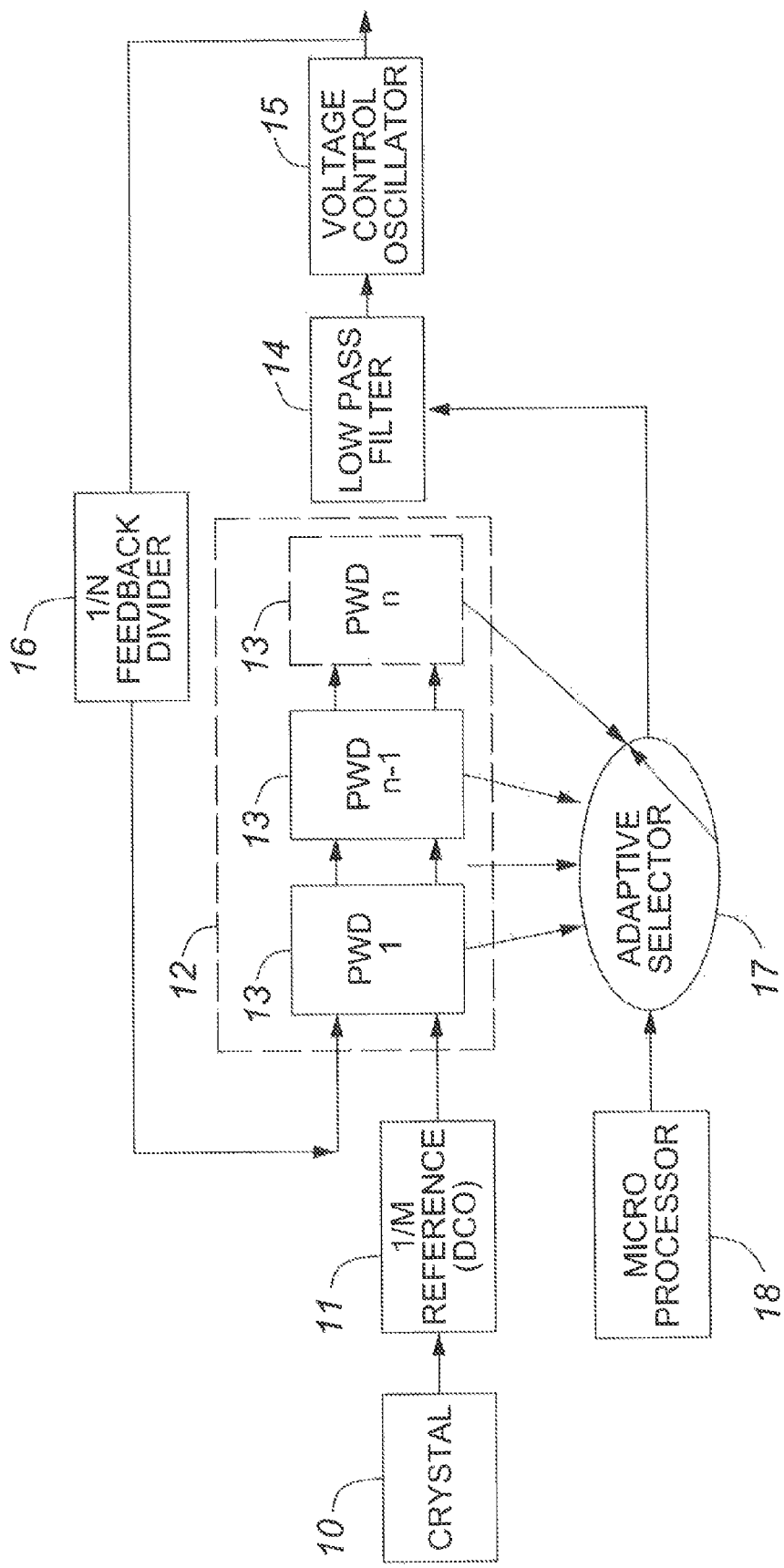
FIG. 1 is a block diagram of a high gain low jitter PLL with a cascaded pulse width double detector bank in accordance with one embodiment of the invention.

The phase locked loop frequency synthesizer shown in FIG. 1 comprises a stable crystal oscillator 10, for example designed to run at 100 MHz, driving a reference digital controlled oscillator (DCO) 11, which divides the output frequency of the crystal oscillator 10 by an integer value M.

The output of the DCO 11 is input to the reference input of phase/frequency (PFD) detection module 12, which is made up of a series of sub-modules in the form of pulse width doublers 13 whose function will be described in more detail with reference to FIG. 2. The output of the PFD module 12 is passed through the loop filter 14, which generates the control signal for voltage controlled oscillator (VCO) 15. This in turn generates the output clock at the desired center frequency selected by the user depending on the values of M and N.

The output of the VCO 15 is feedback to the feedback input of the PFD module 12 via the feedback divider 16, which, in this embodiment, divides output frequency by an integer value N.

Each PWD 13 generates an output pulse whose width represents the delay between the reference input and feedback input. The width of the pulse for a given delay determines the gain. The number of pulse width doublers in the chain is determined by the adaptive selector 17, which is controlled by microprocessor 18.

The adaptive selector 17 examines the pulse width of the output signal from each PWD 13, and then with the help of the microprocessor 18, decides how many stages are needed to provide the appropriate amount of gain. The simplest selection algorithm checks the pulse width against a fixed programmable threshold to select the desired pulse width for the frequency. For example, the adaptive selector 17 may change the output once the pulse width has exceeded 100 ps. The adaptive selector thus acts as a selection module for adjusting the gain of the PFD module 12. As will be described below the output of each PFD module is a pulse whose width is a predetermined multiple of the width of the pulse output of the previous stage, and reflects the phase difference between a predetermined edge of feedback signal F and reference signal R. Generally, the overall gain of the phase locked loop is given by the expression:

$$\text{TotalGain} = K_{det} \times K_{vco} \times K_{loop}/N$$

where $K_{det}$, $K_{vco}$, and $K_{loop}$ are the gains of the PFD, VCO, and loop filter respectively, and N is the division integer in the feedback loop. It will be seen that the total gain of the loop changes with frequency (changes with N). For any particular phase locked loop there is an optimum gain at which all the noises (from every source) are balanced and the total noise is minimized. The object of the circuit shown in FIG. 1 is to keep the gain at the optimum value, or at least within a given range, despite changes in output frequency. As the output frequency is increased, the gain is reduced by decreasing the pulse width of the PFD block and vice versa. Exemplary values are Kvco=100 MHz/Volt, N=⅜, Kdet=⅜ mA/Hz, Kloop=100 ohm.

The adaptive selection can alternatively be implemented in pure hardware, although use of the microprocessor 18 offers more flexibility for future evolution. The selection policy is dependent mainly on the center frequency. Each time a new center frequency is selected by the user, the adaptive selector preferably changes the number of needed stages. Its main objective is to find an optimum pulse width for each center frequency with the best signal to noise ratio.

In the case of an integer PLL architecture, the fractional reference operates at a different frequency, and thus pre-calculated loop gain will different. The adaptive selector will find the optimum gain automatically.

In the case of a fractional PLL architecture, although the integer reference operates at the same frequency, the feedback divider N integer changes according to the fractional center frequency pattern, typically determined by a delta-sigma modulator controlling the feedback divider. In this case, the sigma delta modulator will produce quantization noise at the different frequency and at a different amplitude, which also means that the loop bandwidth is different from the pre-calculated bandwidth.

Although the embodiment shown in FIG. 1 employs a chain of pulse width doublers, it will be appreciated that any multiple or sub-multiple for the pulse width may be employed. Also, the pulse width could be continuously varied with suitable circuitry.

Figure 2:
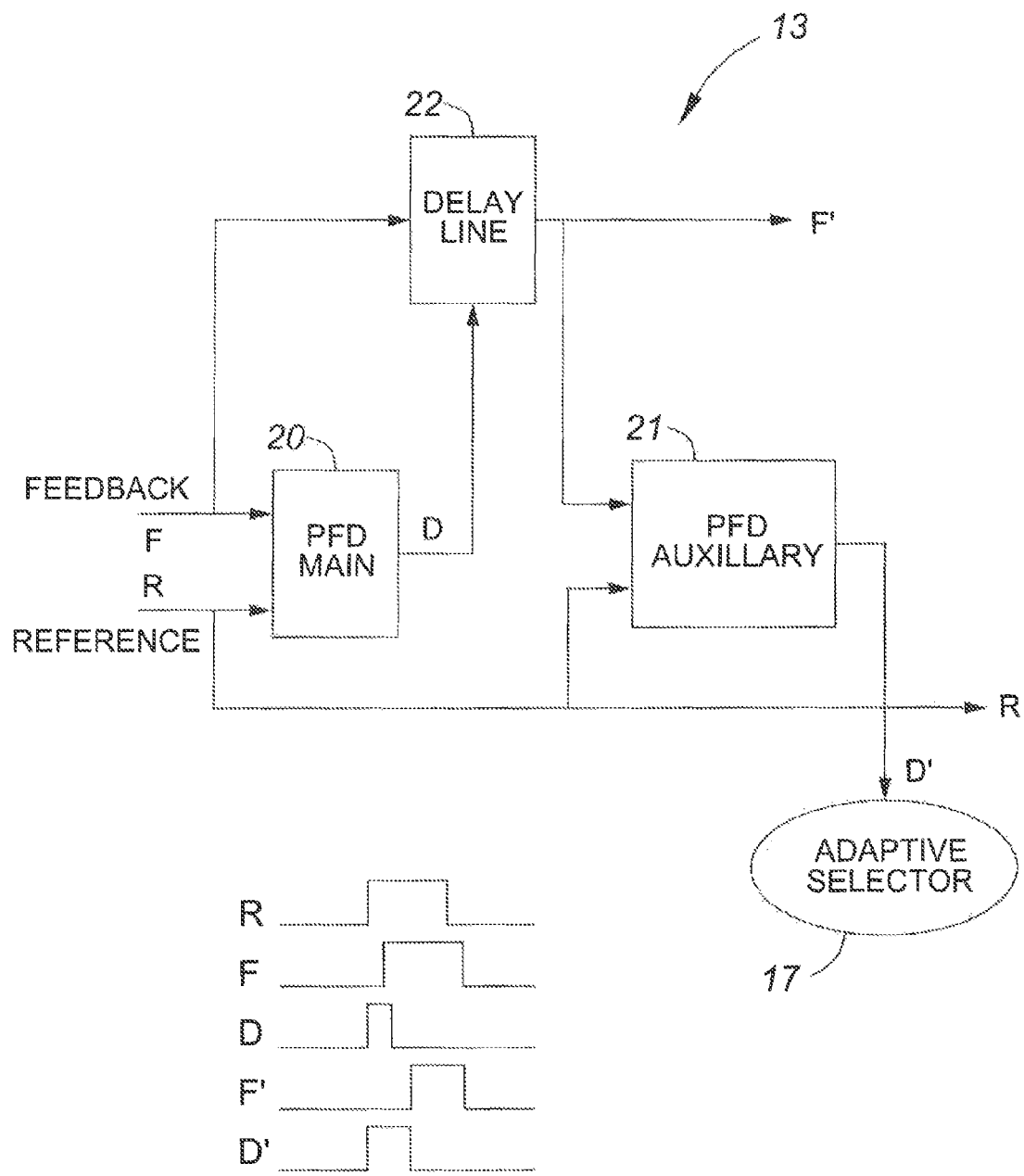
FIG. 2 is a block diagram of a pulse width doubler (PWD) with associated timing diagram.

In the specification on page 10, line 13 FIG. 2 shows the structure of the PWDs 13. Each PWD 13 is in the form of a sub-module comprising a pair of PFDs, namely a main PFD 20 and an auxiliary PFD 21. The main PFD receives the local reference signal R and local feedback signal F at its respective inputs and produces an output pulse D having a width representing the delay or error signal between the local reference and local feedback signals at the input of PFD 21. The output of the first PFD is input as a control input to the delay line 21, which delays the local feedback signal F by an amount equal to the delay D. The delay line 22 in turn outputs a delayed feedback signal F', which is delayed by D and fed to the local feedback input of the auxiliary PFD 21, which receives the reference signal R at its second input. The trailing edge of F may be maintained in F' because the reference signal and feedback signal is much wider than the delay D.

The result is that the auxiliary PFD 21 produces a signal D' having twice the pulse width of the output signal D produced by the first PFD 20, and signal D' is fed as an input to adaptive selector 17, which adaptively couples signal D' from one of the various PWDs 13 to low pass filter 14. Low pass filter 14 is not responsive to signals that are extremely narrow, such as femtosec length pulses which are typical of signal D of the first main PFD 20. Signal D' is double the pulse width of signal D.

The feedback signal F' has its rising edge delayed by the delay D between the feedback and reference signals. The trailing edge of feedback signal F' preferably remains the same as that of feedback signal F, for ease of implementation. When the modified feedback signal F' is passed to the next PWD 13, the first PFD 20 of the next PWD 13 produces another signal having twice the pulse width of the original delay, equivalent to D', and feedback signal F' is then delayed by amount D' due to the action of the respective delay line 22 and passed to the auxiliary PFD 21 of the second PWD 13, which doubles the delay again and so on down the chain. Each PWD 13 thus produces a feedback signal whose leading edge is delayed from the input signal by the difference between the reference signal and the received feedback signal. Each subsequent PWD 13 thus has an increased D and D'. The first PWD 13 thus outputs a signal D' having a pulse width equal to twice the difference between the leading edges of reference signal R and feedback signal F, and a signal F' having a leading edge delayed by twice the difference between the leading edges of reference signal R and feedback signal F. The second PWD 13 thus output a signal D' having a pulse width equal to 4 times the difference between the leading edges of reference signal R and feedback signal F; and the third PWD 13 thus outputs a signal D' having a pulse width equal to 8 times the difference between the leading edges of reference signal R and feedback signal F.

It is convenient to use pulse width doublers since they fit with the binary structure of the device, are relatively easy to implement, and their simple structure minimizes noise. However, it will be appreciated that each block can multiply by a different integer. Moreover, fractional multiplication is possible, and in theory a continuous analog delay line could be employed. This becomes more feasible with submicron process technology.

Figure 3:
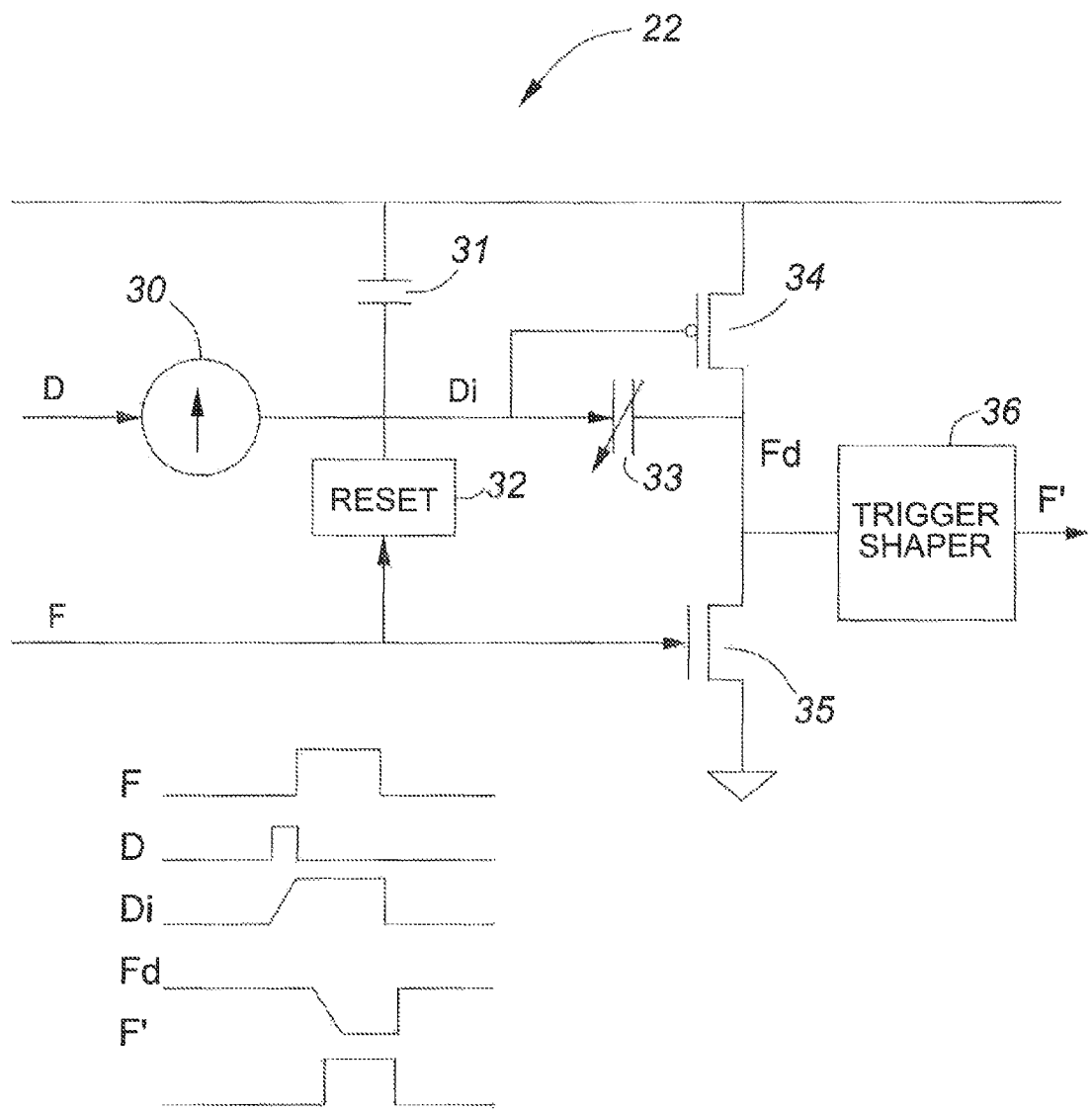
FIG. 3 is a circuit diagram of an analogue delay line circuit with associated timing diagram.

FIG. 3 shows an example of the delay line 22. The delay signal D from the PFD 20 is applied to a current source 30, which charges an integrating capacitor 31 reset by block 32. The current source 30 is connected to varactor 33 and the gate of field effect transistor 34, and field effect transistor 34 is arranged in series with field effect transistor 35. The common point of the transistors 34, 35 is connected to trigger shaper 36, which outputs the delayed feedback signal F'.

Since the duty cycle of the feedback signal F is always larger than the pulse width of D, the rising edge of D creates a ramping slope Di for charging capacitors 31 and varactor 33. The falling edge of F resets the capacitor 31 to the DC voltage. The current source 30 is a constant current source excited by the pulse D.

The varactor 33 is tuned such that the discharge time of signal Fd, i.e. the input to trigger shaper 36, is exactly the same as the charging time of signal Di, i.e. the signal coupled to the gate of FET 34, responsive to the action of varactor 33. In this way, the feedback signal F is delayed by the input pulse width of signal D. The typical range is around 100 ps.

The trigger shaper 36 recovers the sharp edge of the output signal. It could be a Schmitt trigger circuit or any other quite similar device. Whatever amount of charge flows into the varactor 33 is preferably discharged before the trigger shaper can trigger the rising edge for F'.

These simple circuits are mainly built with capacitors and have no significant resistors (other than parasitic or the resistor inside the pulse shaper) involved, and thus the internal noise is very low. The current of current source 30, typically implement in a charge pump, is normally high in order to integrate enough voltage difference to drive the varactor 33, and thus the current noise is low as well. Because of their simplicity however the embodiment of FIG. 3 only works in one direction, for example, when the reference signal leads the feedback signal, and not vice versa. More complicated circuits could be designed to work in both directions, but would also tend to increase noise.

In practice, it is not always possible to let the reference signal R lead the VCO feedback signal F, thereby forcing the PFD to work only in the positive region. For further jitter improvement, the symmetrical arrangement of PWDs shown in FIG. 4 can be used to handle wider detection ranges wherein either signal can lead the other.

Figure 4:
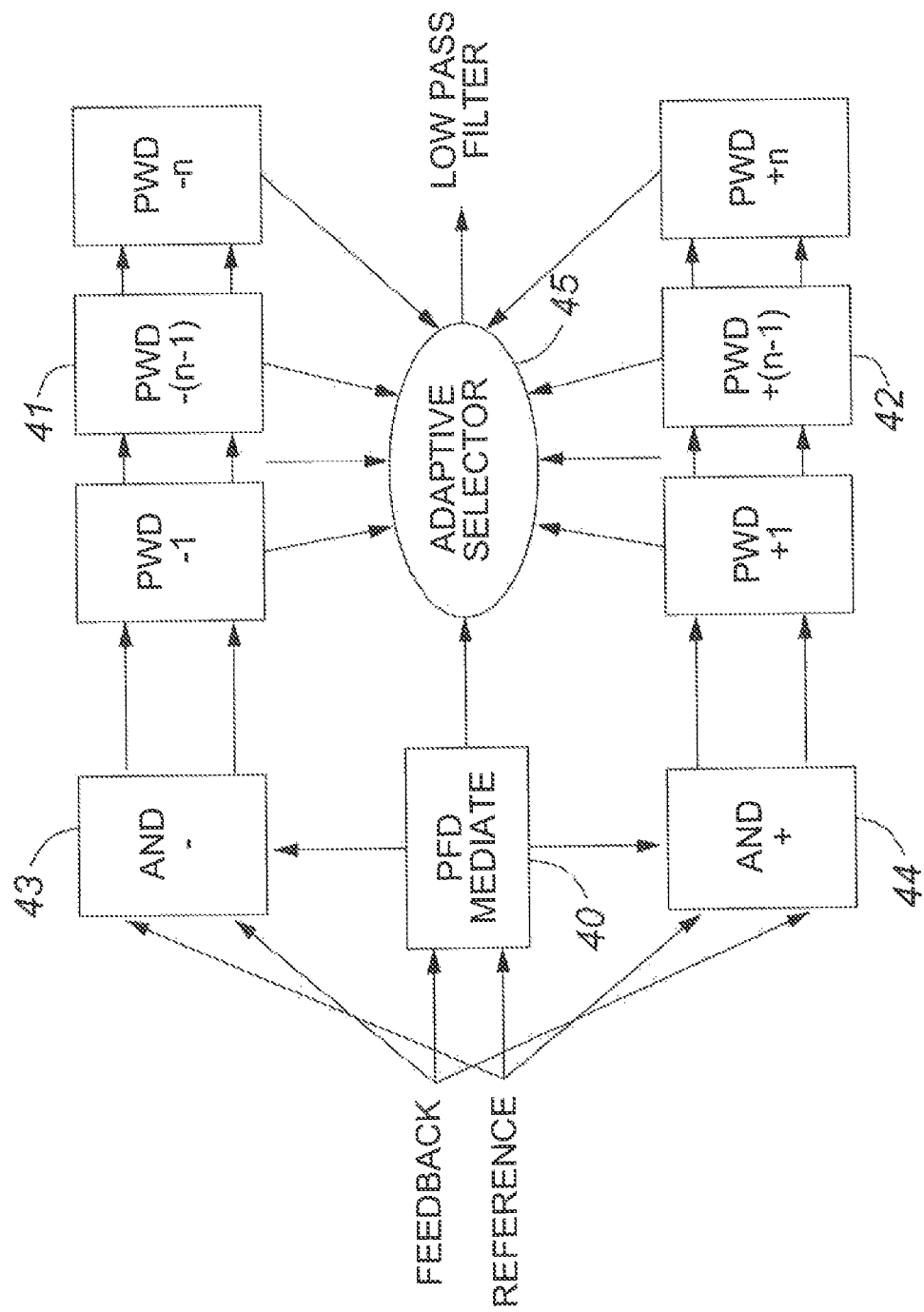
FIG. 4 is a block diagram of a butterfly-style PFD bank in accordance with a second embodiment of the invention.

In FIG. 4, a PFD mediator module 40 determines which of the feedback and reference signals is leading the other and activates either the upper chain 41 or the lower chain 42 of PWDs by enabling AND gates 43, 44. The circuit then operates in the same way as previously described to optimize the pulse width of the error signal. The adaptive selector 45 selects the appropriate number of PWDs to ensure the appropriate pulse width.

The use of additional PWDs increases the signal level at the output of the PFD module. Since the PFD module produces a relatively clean signal, the signal-to-noise ratio in relation to the noise generated in other downstream components, such as the thermal noise coming from resistive elements, in the loop filter is improved.

There is however some non-linear noise generated within the PFD, which is amplified when the output signal is quantized using a sigma-delta modulator. In particular, the noise is increased when the pulse width becomes too large or too small.

Figure 5:
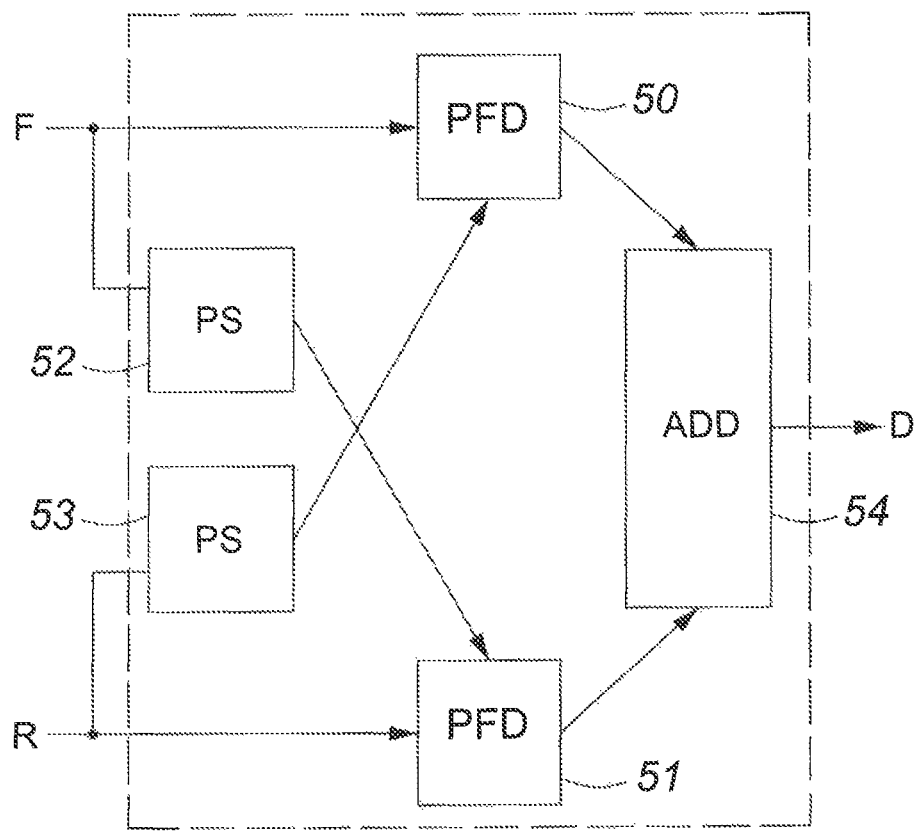
FIG. 5 is block diagram of a split symmetric PFD Bank in accordance with a third embodiment of the invention.

The arrangement shown in FIG. 5 addresses this problem. In this arrangement, each individual PFD is replaced by a pair of elementary PFD's and a pair of phase shifters 52, 53 in a cross over arrangement. The lower elementary PFD 51 receives the phase shifted feedback signal at one input and the upper elementary PFD 50 receives the phase shifted reference signal at one input. The upper elementary PFD 50 receives the direct feedback signal at the other input and the lower PFD 51 receives the direct reference signal at its other input. The outputs of the two elementary PFDs 50, 50 are added in adder 54 to give the delay signal D representing the phase difference between the two input signals. The phase shift is programmable and has to be carefully set so as avoid introducing any additional noise into the system.

Generally, the PFDs are non linear in the region of the origin. By using two phase shifters, 52, 53, as shown in FIG. 5, working in opposition in the linear region displaced from the origin, the net effect is to create a PFD operating about a virtual origin. An exemplary phase shift would be 300 femtoseconds. 100 femtoseconds is also envisaged depending on the hardware.

It will be appreciated that the module shown in FIG. 5 can be made part of a pulse width doubler as shown in FIG. 2. In this case the module shown in FIG. 5 replaces a single PFD, such as 20, 21, shown in FIG. 2.

In this architecture the positive and negative PFDs work at the same time unlike the butterfly architecture show in FIG. 4, where only one chain is enabled by the PFD mediator 40.

It will be appreciated that although each solution described above is designed to address one specific source of noise, they can be combined in any way depending on which noise is dominant.

Up to this point, only random noise originating from the PFD and other sources has been addressed. Another source of noise is deterministic interference, which is addressed by the shown in FIG. 6.

Figure 6:
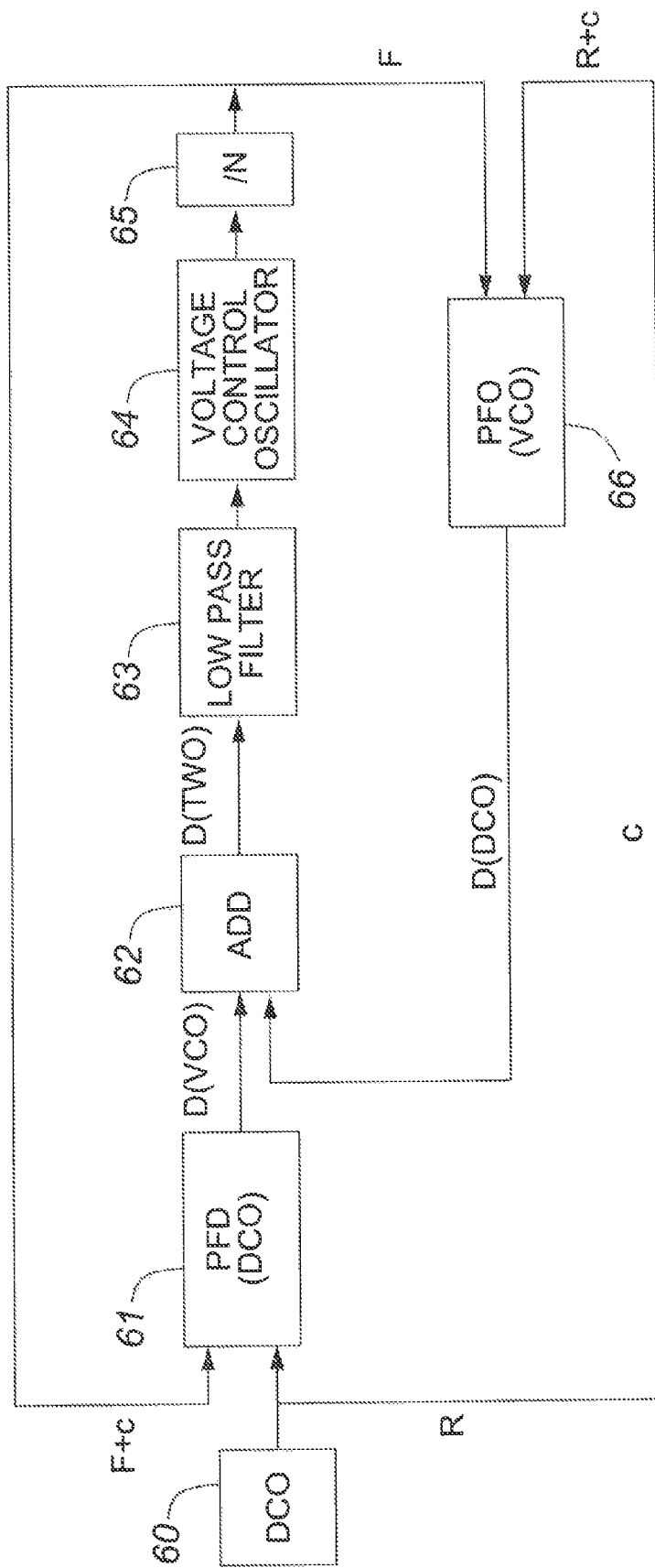
FIG. 6 is a block diagram of a dual PFD bank in accordance with a fourth embodiment of the invention.

In FIG. 6 the phase locked loop with a digital controlled oscillator (DCO) 60 providing the reference signal R comprises a PFD 61 at the input (DCO) side, an adder 62, a low pass filter 63, a voltage controlled oscillator 64, and a divide-by-N divider 65 providing the output signal F, which is fed back to the PFD 61 and to a second PFD 66 on the output (VCO) side. The error signals D from the two PFDs are combined in the adder 62 and fed into the low pass filter 63 to generate the control signal for the VCO 64.

The PFD 61 is physically adjacent the reference side and the PFD 66 is physically adjacent the side of the VCO 62. The coupling noise is thus canceled out. This architecture can be explained as follows:

Assume that c is coupling tone from substrate, air or conductive line, R is the reference signal, F is the feedback signal, as indicated above, for each PFD 61, 66, we have $$D(DCO)=(R+c)-F$$

and $$D(VCO)=R-(F+c);$$

then $$D(Two) = D(DCO) + D(VCO)$$
$$= (R+c) - F + R - (F+c)$$
$$= 2R - 2F$$
$$= 2D(One)$$

where D(DCO) is the output of PFD 61 and D(VCO) is the output of PFD 66. It will be noted that not only does this arrangement cancel out the noise tone c, but it also doubles the signal strength. 2D(One) means two pure delays of R-F, i.e. D(Two)=2D(One).

Figure 7:
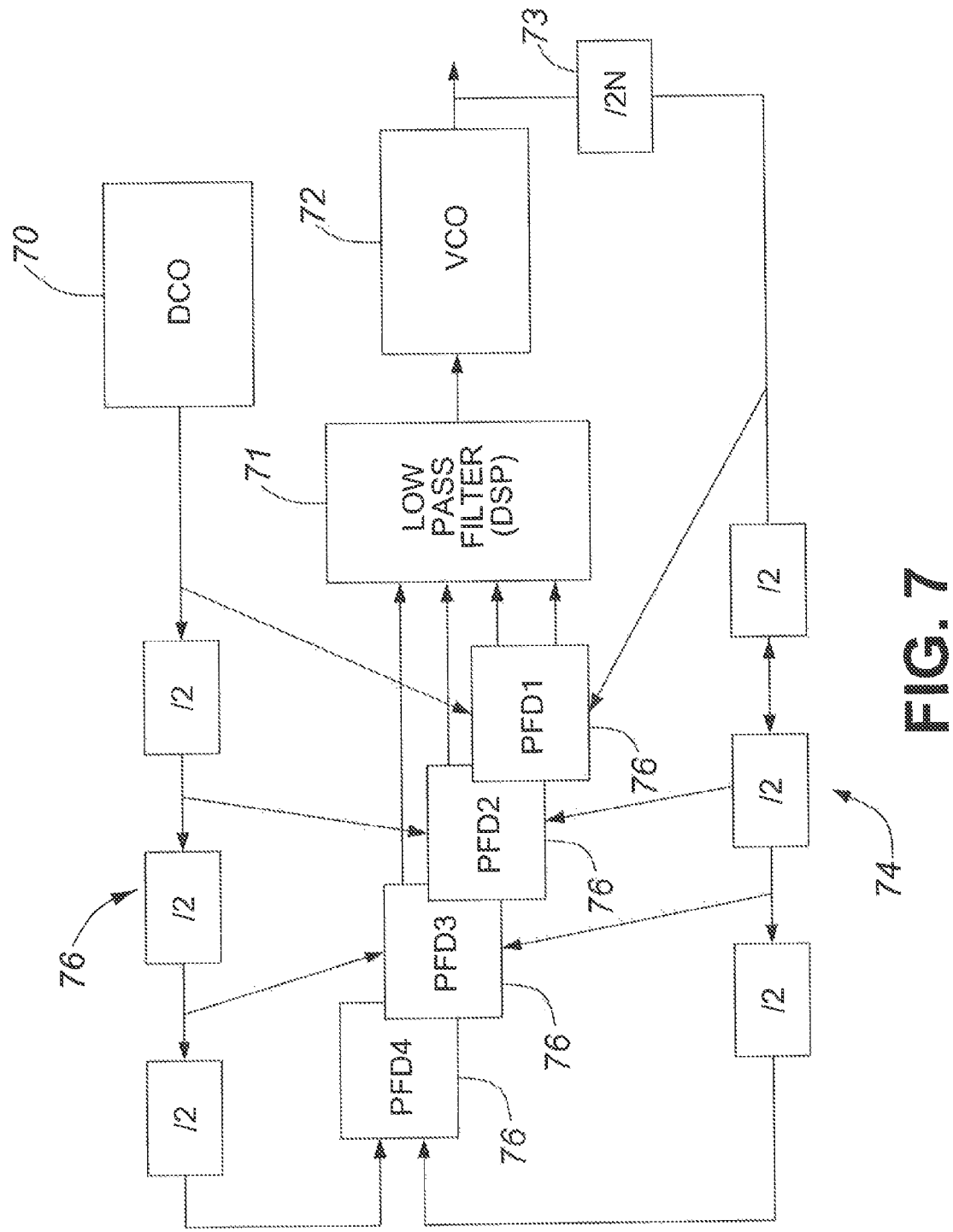
FIG. 7 is block diagram of a multiple-rate PFD bank in accordance with a fifth embodiment of the invention.

While the above solutions help to suppress both random noise and deterministic noise, the arrangement shown in FIG. 7 helps to remove the noise generated by the DCO and VCO. This arrangement comprises a phase locked loop with a DCO 70 as the reference source, a low pass loop filter 71, preferably in the form of a DSP, a VCO 72 producing an output signal and a divider 73 generating the feedback signal. The low pass loop filter 71 may include an analogue weighted adder configured to receive the outputs of the respective phase/frequency detectors. The PFDs 76 may be digital or analog.

The feedback signal from the VCO 72 is passed through a chain of divide-by-2 dividers 74, each halving the frequency. Similarly the reference signal from DCO 70 is fed to the input of a chain of divide-by-2 dividers 75, each halving the frequency The outputs of the respective dividers 74, 75 are coupled to respective feedback and reference inputs of the PFDs 76. It follows that the first PFD operates at $\frac{1}{8}^{th}$ rate, the second at $\frac{1}{4}$ the rate, and so on.

This arrangement is based on the observation that a single PFD cannot be optimized for all user selected fractional center frequencies. By multiple PFDs running at different rates, they can be optimized for different frequencies. A digital signal-processing (DSP) engine can be used to compensate temperature variation of VCO, and also to compensate for nonlinear mismatch of PFD gain.

Mathematically speaking, the series $1/4+1/8+1/16+1/32+\ldots$ to infinity equals $1/2$. However, the use of only four members of the series will result in an error of only 6.25% ($(1/2-1/4-1/8-1/16-1/32)/(1/2)$). If four PFDs are employed, the resulting error from the approximation will only affect the dynamic behavior of the loop when a frequency jump occurs. During the normal locked operation, no error will show up due to this approximation.

As discussed above, in a fractional phase locked loop a sigma-delta modulator controls the feedback divider to create the fractional frequency. When the sigma-delta modulator is imperfect, which may occur at a certain frequency offset, one of the PFDs will catch and amplify the residual quantization error, which can be removed with a notch filter. The filter can be either implemented in traditional analogue form or pure digital form. If the filter is in digital form, such as a multi-rate filter or fractional FFT filter, then PFD could be a TDC (Time-to-Digital Converter) followed by a digital integrator. A sigma delta noise matched multi-rate DSP filter may be used to trade off thermal noise.

Figure 8:
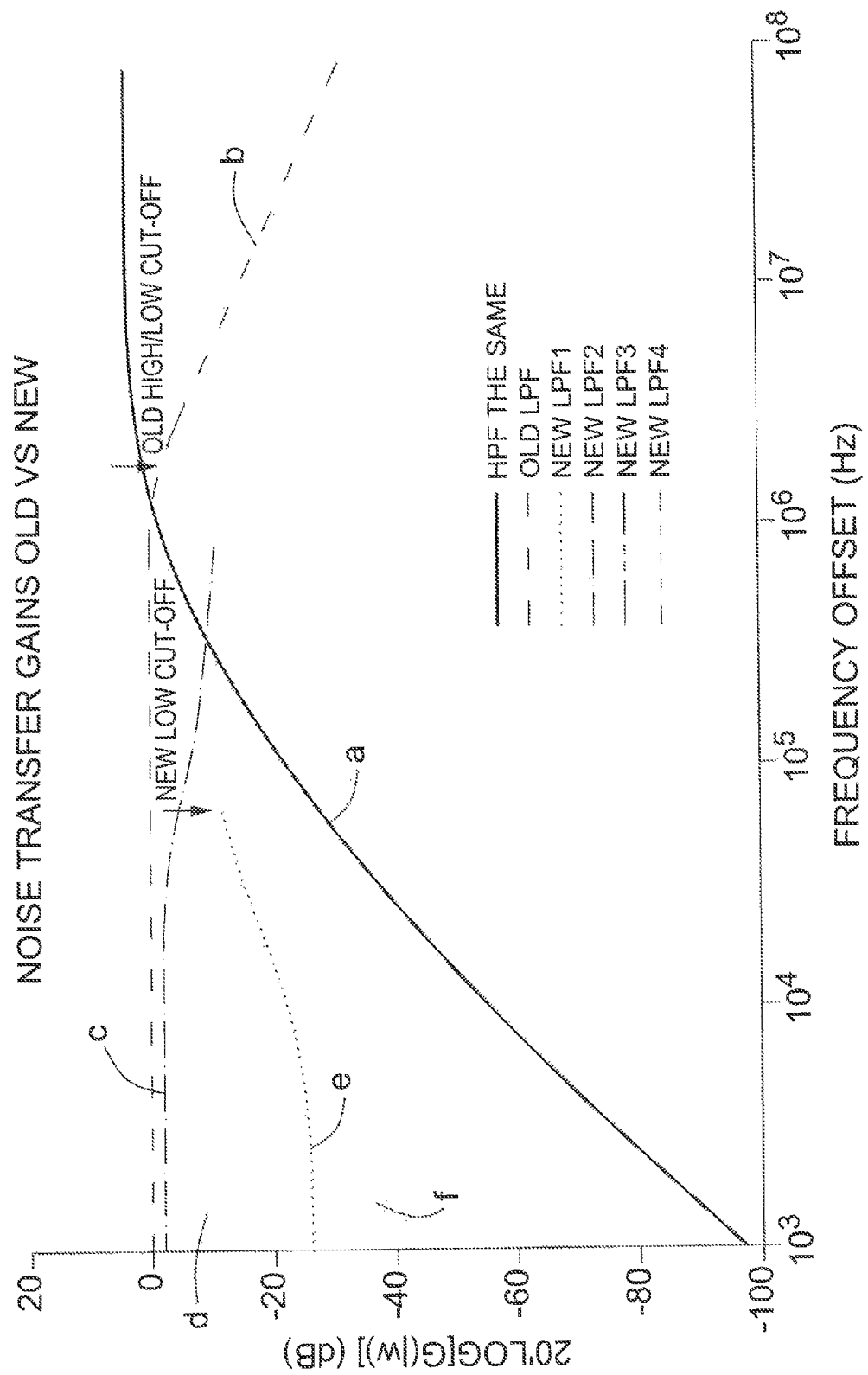
FIG. 8 is a comparison of the transfer function of a single PFD architecture and a multiple PFD architecture.

FIG. 8 shows how the four-PFD system shown in FIG. 7, wherein the PFDs run at different speeds, can separate the DCO sigma-delta perturbation noise from the VCO wandering drift noise. In a traditional PLL, the low-pass (Old LPF) curve b was used to remove DCO noise and the high-pass (HPF) curve a was used to remove VCO noise. In the architecture described herein, the new low-pass (New LPF1) curve c is used to remove DCO noise. The cut off frequency is lower than traditional (Old LPF) curve b, while the high-pass (HPF) curve a remains at the same position.

Although the filters (LPF2/3/4) are band pass, as the delta sigma shaper converts low frequency noise to high frequency noise, the contribution will be progressively lower towards the lower speed PFDs.

The New LPF1 curve c provides an additional 10 dB gain versus the Old LPF curve b at the expense of additional low cost PFDs.

The theory is based on the fact that in a traditional single PFD PLL, the high pass and low pass curves are related by the equation:

$$H_H + H_L = 1$$

where $H_H = 1/(1+T)$ and $H_L = T/(1+T)$, and T is the total open loop gain. For the compound structure shown in FIG. 7, $H_H = 1/(1+\Sigma T_i)$, for each individual path, $H_{Li} = T_i/(1+\Sigma T_i)$, where $T_i$ is its total open loop gain.

The low pass filter $H_L$ is split into four components. The individual low pass filter is no longer constrained by the high pass filter. There is now more freedom to design each filter to for its wide fractional residual error range.

Figure 9:
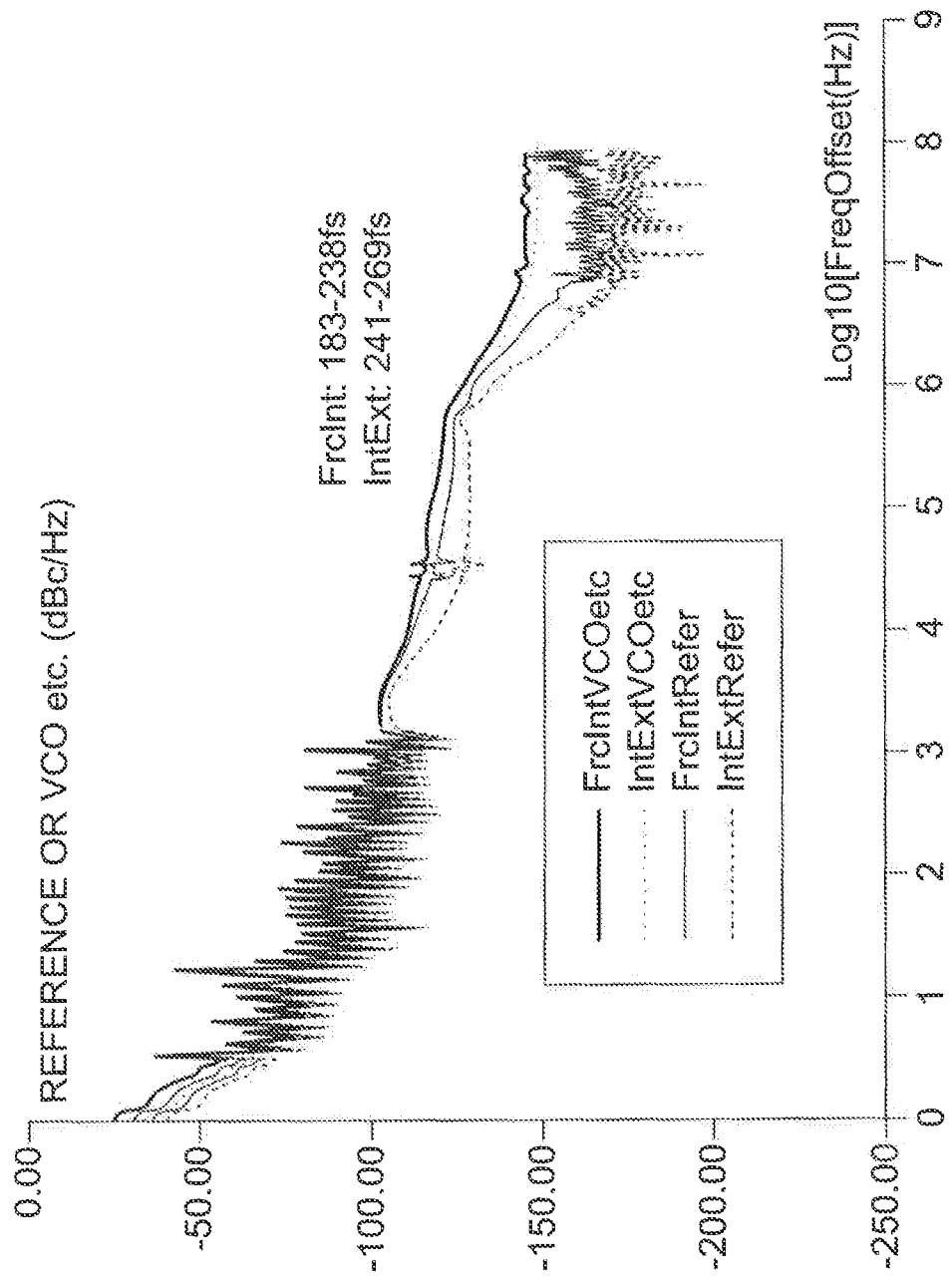
FIG. 9 shows the results of lab measurements for fractional N (integer M) and Integer N (Fractional M) Architectures.

FIG. 9 shows the phase noise break down for a typical PLL calculated using an Excel spreadsheet based on lab measurements data using emulated DCO noise as input. Plot FrcIntV-COetc is the measured VCO and fractional loop with internal filter noise. Plot IntExtVCOetc is the measured VCO and integral loop with external filter noise. Plot FrcIntREF is the measured reference noise for fractional loop internal filter setting and plot IntExtREF is the measured reference noise for integral loop external filter setting. It will be observed that the total gain is limited to 70 dB mentioned above. An additional 10 dB gain from the novel arrangement of banked PFDs described above will halve the jitter.

As can be seen, for fractional internal setting, the measured jitter is from 183 to 238 femtosec and for integral external setting, the measured jitter is from 241 to 269 femtosec. The jitter is defined as integration between 12 KHz to 20 MHz of the reference curve plus VCO curve, plus any other sources. The steeper or lower the curve in the concerned region, the smaller will be the jitter. As a rule of thumb, every average 6 dB drop of the curve will have the jitter number, thus a 10 dB drop will result in improving a 269 femtosec jitter into a jitter of <100 femtosec.

The frequency synthesizer can be mathematically considered a frequency multiplier. The fundamental relationship is $$Fvco = Fref * N/M$$

For a fractional PLL, the European style is to keep N an integer, making M fractional. This puts the design pressure on the low frequency digital circuit side, such as suppressing DCO noise, while North American philosophy is to keep M an integer and make N fractional. This puts the design pressure on the high frequency analogue circuit side. Either way the same mathematical operations are fulfilled. Neither method can decrease both VCO and DCO noise at the same time.

The following table shows a sample simulation result, for a typical RC loop filter, with R1=300 ohm, C1=250 nf, C2=1 nf, Kvco=140 MHz/V, with the meanings of R1, C1, C3 and Kvco in accordance with standard second order RC loop filter component labels. The resistor is almost the smallest possible, while capacitors are roughly the largest possible. The resistor thermal noise for one PFD baseline case is already over 100 fs. This has to be reduced first by using additional PFDs with pulse width multiplying capability described in FIG. 1. Coupling noise is modeled by direct FM modulation method.

| Number of PFDs (Width) | Filter Thermal Noise | VCO noise | Reference noise | LC coupling noise | Overall noise |
| --- | --- | --- | --- | --- | --- |
| Baseline | 129 fs | 98 fs | 53 fs | 224 fs | 276 fs |
| X2 | 81 fs | 89 fs | 71 fs | 129 fs | 191 fs |
| X4 | 55 fs | 78 fs | 88 fs | 69 fs | 148 fs |
| X8 | 35 fs | 72 fs | 111 fs | 35 fs | 143 fs |

Embodiments of the invention support the future jitter design goal of 100 femtosecond (fs) for the LTE-A (Long Term Evolution Advanced) base station market and allowing an improvement over either Hittite's analogue PLL architecture (78 fs), Texas Instrument's Dual PLL architecture (100 fs) or SiLabs' digital PLL architecture (<300 fs) noted above.

It should be appreciated by those skilled in the art that any block diagrams herein represent conceptual views of illustrative circuitry embodying the principles of the invention. As is common practice in the art the block diagrams illustrated may be implemented as software modules using signal-processing techniques in a processor, such as a digital signal processor.

A processor may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non volatile storage. Other hardware, conventional and/or custom, may also be included. The term circuit is used herein to encompass functional blocks that may in practice be implemented in software.

The invention claimed is:

1. A phase locked loop frequency synthesizer comprising:
   a controlled oscillator for generating an output signal at an operating frequency;
   a phase/frequency detector module with variable gain configured to compare a feedback signal derived from the controlled oscillator with a reference signal to generate an error signal having a pulse width representative of a delay between said feedback signal and said reference signal, whereby the pulse width for a given error signal is determined by the gain of said phase/frequency detector module;
   said phase/frequency detector module comprising a chain of serially coupled phase/frequency detector sub-modules, each sub-module outputting a signal having a pulse width that for a given error signal incrementally increases at respective outputs of the sub-modules along the chain;
   a loop filter for processing said at least one error signal from said phase/frequency detector module to generate a control signal for the controlled oscillator; and
   a selection module for adjusting the gain of said phase/frequency detector module in accordance with a programmable threshold based on the operating frequency by switching between outputs of said sub-modules to provide said error signal.

2. A phase locked loop frequency synthesizer as claimed in claim 1, wherein said selection module is configured to adjust the gain of the phase/frequency detector module to maintain the overall gain of the phase locked loop within a defined range as the operating frequency changes.

3. A phase locked loop frequency synthesizer as claimed in claim 1, wherein each said phase/frequency detector sub-module comprises a pulse width doubler.

4. A phase locked loop frequency synthesizer as claimed in claim 1, wherein each said sub-module comprises:
   first and second phase/frequency detectors in tandem; and
   a delay line; and
   wherein said first phase/frequency detector of each said sub-module has first and second inputs receiving local feedback and local reference signals respectively, and an output producing an output signal representing a delay between the local feedback and local reference signals at said first and second inputs, said local feedback signal at said first input of said first phase/frequency detector is applied to an input of said delay line, said output signal of said first phase/frequency detector is applied as a control input to said delay line, and an output of said delay line is applied as to a first input of said second phase/frequency detector, said local reference signal at the second input of said first phase/frequency detector is applied to a second input of said second phase/frequency detector, and a second output of said second phase/frequency detector providing an output of said sub-module.

5. A phase locked loop frequency synthesizer as claimed in claim 4, wherein said delay line comprises a current source excited by the output pulse from the first phrase/frequency detector and configured to charge a capacitor, said capacitor controlling a first of a pair of switching elements, a second of which generates said delayed signal applied to the input of said second phase/frequency detector.

6. A phase locked loop frequency synthesizer as claimed in claim 1, comprising first and second said phase/frequency detector modules, said first phase/frequency detector module being configured to process said feedback and reference signals when the feedback signal leads the reference signal, and a second phase/frequency detector module being configured to process said feedback and reference signals when the reference signal leads the feedback signal, and a phase mediator configured to determine which of said feedback and reference signals leads the other and activate the appropriate phase/frequency detector module.

7. A phase locked loop frequency synthesizer as claimed in claim 6, wherein said phase/frequency detector sub-modules are pulse width doublers.

8. A phase locked loop frequency synthesizer as claimed in claim 1, wherein each said phase/frequency detector in said sub-modules comprises a first elementary phase/frequency detector receiving a local feedback signal at a first input, a second elementary phase/frequency detector receiving a local reference signal at a second input, a pair of phase shifters in a cross over arrangement whereby the first elementary phase/frequency detector receives a phase shifted version of the local reference signal at a second input and the second elementary phase/frequency detector receives a phase shifted version of the local feedback signal at a second input; and
   an adder for combining the output signals from said first and second elementary phase/frequency detectors to provide an output of said phase/frequency detector.

9. A phase locked loop frequency synthesizer comprising:
   a reference source generating a reference signal having a frequency;
   a first chain of n dividers progressively dividing the frequency of the reference signal by to produce a succession of decreasing frequencies;
   a controlled oscillator for generating an output signal at a desired frequency;
   a second chain of n dividers progressively dividing the frequency of the output signal by to produce a succession of decreasing frequencies;
   a succession of phase/frequency detectors operating at different rates wherein outputs of respective divider pairs comprising one divider from each chain are coupled respectively to feedback and reference inputs of successive phase/frequency detectors to generate a respective error signal at each phase/frequency detector; and
   a loop filter for processing said respective error signals from said phase/frequency detectors to generate a control signal for the controlled oscillator.

10. A phase locked loop frequency synthesizer as claimed in claim 9, wherein said loop filter is configured to filter an output of each phase/frequency detector separately.

11. A phase locked loop frequency synthesizer as claimed in claim 9, wherein said loop filter comprises a digital signal processor with multiple inputs connected to outputs of said respective phase/frequency detectors operating at different rates.

12. A phase locked loop frequency synthesizer as claimed in claim 9, further comprising a chain of frequency dividers in each of a feedback path and a reference path to progressively divide the frequency in each said path.

13. A phase locked loop frequency synthesizer as claimed in claim 9, wherein said loop filter comprises an analog weighted adder configured to receive at its inputs the outputs of respective said phase/frequency detectors.

14. A phase locked loop frequency synthesizer comprising:
   a voltage controlled oscillator for generating an output signal at an operating frequency a digital controlled oscillator for generating a reference signal physically separate from the voltage controlled oscillator;

a first phase/frequency detector for comparing a feedback signal derived from the voltage controlled oscillator with the reference signal to generate a first error signal, said feedback signal including a coupling tone, and said first phase/frequency detector being physically adjacent said digital controlled oscillator;

a second phase/frequency detector for comparing the feedback signal derived from the voltage controlled oscillator with the reference signal to generate a second error signal, said reference signal including said coupling tone, said first phase/frequency detector being physically adjacent said voltage controlled oscillator;

a combiner for combining said first and second error signals to cancel out said coupling tone; and a loop filter for processing said combined first and second error signals to generate a control signal for the voltage controlled oscillator.

15. A phase locked loop frequency synthesizer as claimed in claim 14, wherein said combiner is an adder.

16. A method of reducing jitter in a phase locked loop frequency synthesizer, comprising:

receiving a feedback signal derived from a controlled oscillator;

receiving a reference signal from a reference source;

comparing said feedback signal with said reference signal in a phase/frequency detection module to generate error signal for a loop filter, said error signal having a pulse width representative of a delay between said feedback signal and said reference signal, the pulse width for a given error signal being determined by the gain of said phase/frequency detector module; and adjusting a gain of the phase/frequency detection module in accordance with a programmable threshold based on the operating frequency by switching between outputs of a chain of serially coupled phase/frequency detector sub-modules that output a signal having a pulse width that for a given error signal incrementally increases at respective outputs of the sub-modules along the chain.

17. A method as claimed in claim 16, wherein the gain of the phase/frequency detection module is varied in order to maintain the overall gain of the phase locked loop within a defined range.

* * * * *